(12) United States Patent
Ko

(10) Patent No.: US 7,838,378 B2
(45) Date of Patent: Nov. 23, 2010

(54) SEMICONDUCTOR DEVICE AND MANUFACTURING METHOD THEREOF

(75) Inventor: Kwang Young Ko, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 509 days.

(21) Appl. No.: 11/896,206

(22) Filed: Aug. 30, 2007

(65) Prior Publication Data
US 2008/0054407 A1 Mar. 6, 2008

(30) Foreign Application Priority Data
Aug. 31, 2006 (KR) .................... 10-2006-0083857

(51) Int. Cl.
*H01L 21/331* (2006.01)
(52) U.S. Cl. ............... 438/364; 438/369; 438/378; 257/E21.372
(58) Field of Classification Search ............ 438/309, 438/353, 364, 369, 368, 542; 257/E27.015, 257/E27.019, E27.053, E21.372
See application file for complete search history.

(56) References Cited

U.S. PATENT DOCUMENTS 4,180,827 A * 12/1979 Gates ...................... 257/556

5,387,553 A * 2/1995 Moksvold et al. ............ 438/339
6,563,193 B1 * 5/2003 Kawaguchi et al. .......... 257/575

FOREIGN PATENT DOCUMENTS

JP 55-001158 1/1980

OTHER PUBLICATIONS

English translation of Notification of First Office Action issued on Dec. 26, 2008, from the State Intellectual Property Office of the People's Republic of China in related Chinese application No. 200710147180.6 (2 pages).
English translation of Notification of Second Office Action issued on Jun. 26, 2009, from the Patent Office of the People's Republic of China in related Chinese application No. 200710147180.6 (2 pages).

* cited by examiner

*Primary Examiner*—Ha Tran T Nguyen
*Assistant Examiner*—Daniel Whalen
(74) *Attorney, Agent, or Firm*—Finnegan, Henderson, Farabow, Garrett & Dunner, L.L.P.

(57) ABSTRACT

A semiconductor device and a method for manufacturing the semiconductor device are provided. The method includes forming a collector region of a second conductivity type in a semiconductor substrate of a first conductivity type; forming a base region of the first conductivity type in the collector region, and forming an emitter region of the second conductivity type into the base region; forming an emitter in the emitter region, and forming a collector in the collector region; and forming a base in the semiconductor substrate through implanting high concentration impurity ions of the first conductive type into the semiconductor substrate.

5 Claims, 2 Drawing Sheets

US 7,838,378 B2

SEMICONDUCTOR DEVICE AND MANUFACTURING METHOD THEREOF

CROSS-REFERENCE TO RELATED APPLICATIONS

The present application claims the benefit of priority under 35 U.S.C. 119 to Korean Patent Application No. 10-2006-0083857 (filed on Aug. 31, 2006), the entire contents of which are incorporated herein by reference.

BACKGROUND

The present invention relates to a semiconductor device and a method for manufacturing the semiconductor device.

A bipolar junction transistor (BJT), which includes an emitter, a base, and a collector, can be categorized into a vertical type BJT or a horizontal type BJT, based on the moving direction of electrical charges emitted from the emitter.

In a vertical type BJT, the electric charges emitted from the emitter moves along a vertical direction to a surface of a semiconductor substrate of the vertical type BJT, and flows to the collector.

The emitter in the vertical type BJT often has a first conductivity, the base has a second conductivity and encloses the emitter, and the collector has the first conductivity and encloses the base. The first conductivity may be a P-type conductivity and the second conductivity may be an N-type conductivity, so as to form a PNP transistor. Alternatively, the first conductivity may be an N-type conductivity and the second conductivity may be a P-type conductivity, so as to form an NPN transistor.

SUMMARY

A semiconductor device having a narrow base width is provided. Further, a method for manufacturing the semiconductor device is also provided.

In one embodiment, a method for manufacturing a semiconductor device includes: forming a collector region of a second conductivity type in a semiconductor substrate of a first conductivity type through implanting impurity ions of the second conductivity type into the semiconductor substrate; forming a base region of the first conductivity type in the collector region through implanting impurity ions of the first conductivity type into the collector region; forming an emitter region of the second conductivity type in the base region through implanting impurity ions of the second conductivity type into the base region; forming an emitter in the emitter region through implanting high concentration impurity ions of the second conductive type into the emitter region; forming a collector in the collector region through implanting high concentration impurity ions of the second conductive type into the collector region; and forming a base in the semiconductor substrate through implanting high concentration impurity ions of the first conductive type into the semiconductor substrate.

In another embodiment, a semiconductor device includes: a semiconductor substrate of a first conductivity type; a collector region of a second conductivity type formed in the semiconductor substrate; a base region of the first conductivity type formed in the collector region and in the semiconductor substrate; an emitter region of the second conductivity type formed in the base region; a collector of the second conductivity type formed in the collector region; and an emitter of the second conductivity type formed in the emitter region.

One or more embodiments consistent with the present invention are set forth in the accompanying drawings and the detailed descriptions below. Other features will be apparent to those skilled in the art from the detailed descriptions and the drawings, as well as from the appended claims.

DETAILED DESCRIPTION

Reference will now be made in detail to a semiconductor device and a manufacturing method thereof according to embodiments consistent with the present invention, examples of which are illustrated in the accompanying drawings.

Figure 5:
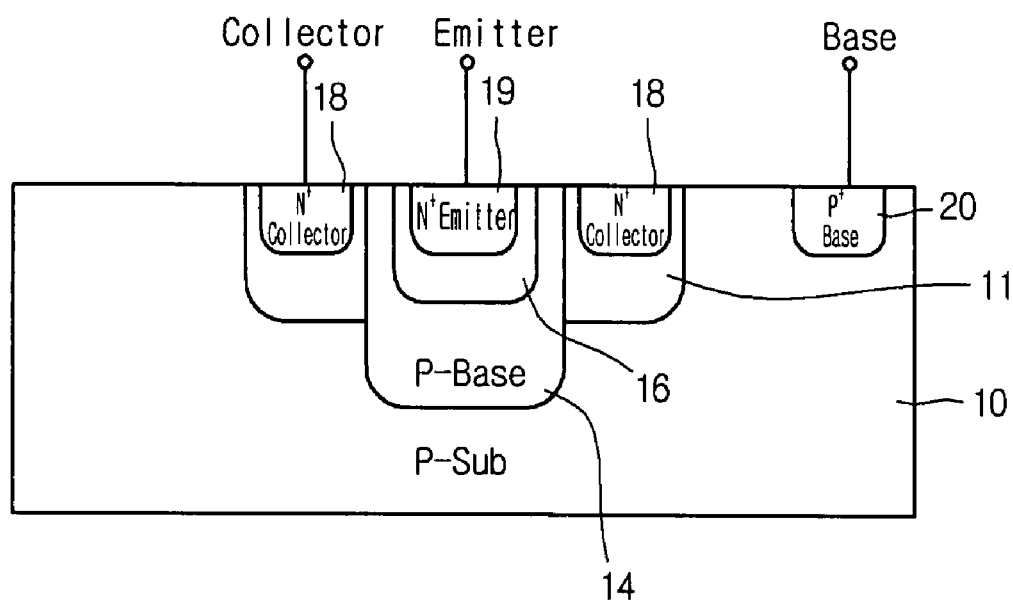

FIG. 5 illustrates a semiconductor device according to an embodiment consistent with the present invention.

Referring to FIG. 5, a semiconductor device includes a P-type base 20 and an N-type collector region 11 formed on a P-type semiconductor substrate 10.

Also, P-type impurity ions are deeply implanted and N-type impurity ions are shallowly implanted into N-type collector region 11, in order to form a P-type base region 14 diffused up to P-type semiconductor substrate 10 and an N-type emitter region 16.

Here, emitter region 16 and base region 14 may be formed using a self-aligning method employing a diffusion coefficient difference between N-type and P-type impurity ions. In one embodiment, a rapid thermal process (RTP) performed at a temperature of about 900-1100° C. for a duration of about 30-60 seconds may be used to minimize the width of base region 14.

An N-type impurity may be implanted in N-type collector region 11 and N-type emitter region 16 so as to form a collector 18 and an emitter 19.

In one embodiment, the flow of current between collector 18 and emitter 19 may be in a horizontal direction, and the width of base 14 may be minimized by using the RTP.

Hereinafter, a method for manufacturing a semiconductor device consistent with the present invention will be described in detail.

FIGS. 1 through 5 are sectional views illustrating a method for manufacturing a semiconductor device consistent with the present invention. It is to be understood that P-type impurity ions and N-type impurity ions, described below, may be interchanged with each other, so as to realize a PNP transistor and/or an NPN transistor in certain embodiments.

Figure 1:
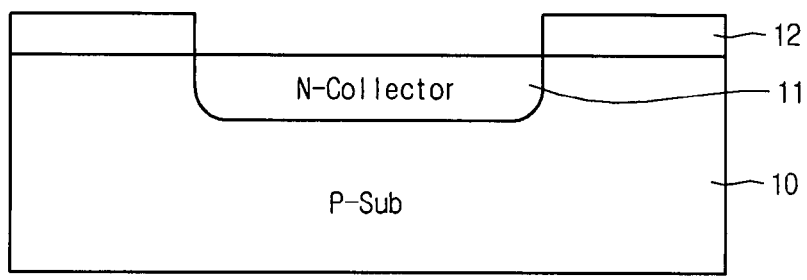
FIGS. 1 through 5 are sectional views illustrating a method for manufacturing a semiconductor device, according to an embodiment consistent with the present invention.

Referring to FIG. 1, a first photoresist pattern 12 may be formed by applying a photoresist material on P-type semiconductor substrate 10, and developing and exposing the photoresist material. Thereafter, collector region 11 may be formed by implanting N-type impurity ions into P-type semiconductor substrate 10 using first photoresist pattern 12 as a mask.

Figure 2:
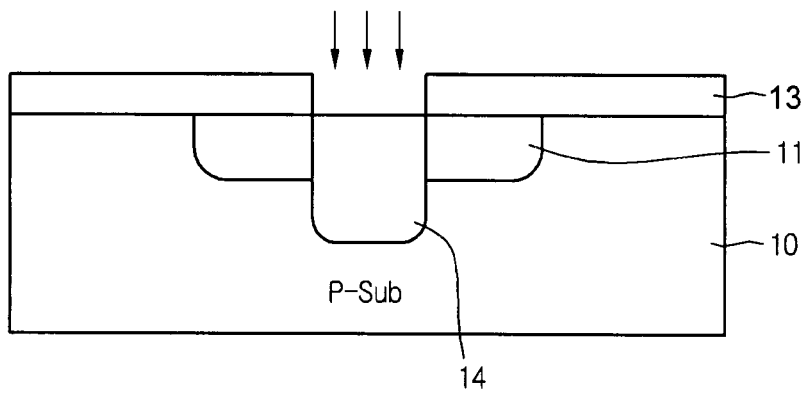
Figure 3:
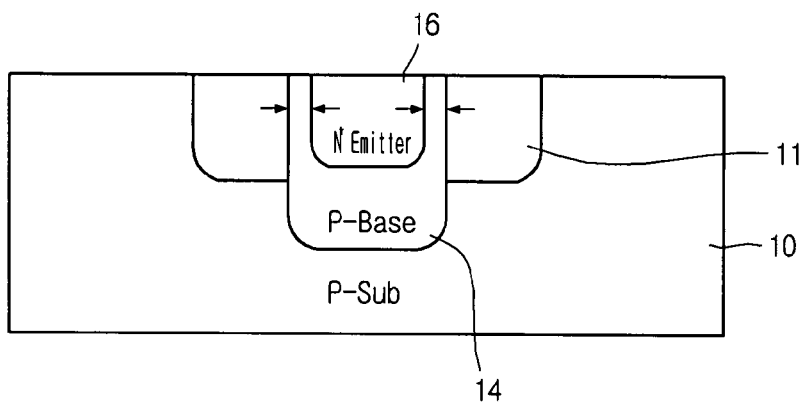

Referring to FIGS. 2 and 3, a second photoresist pattern 13 may be formed by applying a photoresist material on semiconductor substrate 10, and developing and exposing the photoresist material. Thereafter, P-type impurity ions may be implanted in collector region 11 using second photoresist pattern 13 as a mask, so as to form P-type base region 14. Further, N-type impurity ions may be implanted in collector region 11 to form N⁺ emitter region 16.

In one embodiment, the P-type impurity ions may include Boron (B), and the N-type impurity ions may include phosphorous (P) and/or arsenic (As). Impurity processes may be used to form N⁺ emitter region 16.

The width of P-type base region 14 may be self-aligned, because N-type impurity ions have a diffusion coefficient different from that of P-type impurity ions. That is, because P-type impurity ions may have a greater diffusion coefficient than N-type impurity ions, diffusion process is faster in a horizontal direction than in a vertical direction, thus producing a self-aligned base width.

After the P-type impurity ions and the N-type impurity ions are implanted, RTP may be performed to minimize the base width. Arrows in FIG. 3 identify the base width.

In one embodiment, RTP may be conducted at a temperature of about 900-1100° C. for a duration of about 30-60 seconds. Through RTP, the degree of diffusion of impurity ions with different diffusion coefficients can be adjusted to minimize the base width.

Referring to FIG. 3, in one embodiment, P-type base region 14 is formed so that a current can flow horizontally between N⁺ emitter region 16 and N-type collector region 11.

Figure 4:
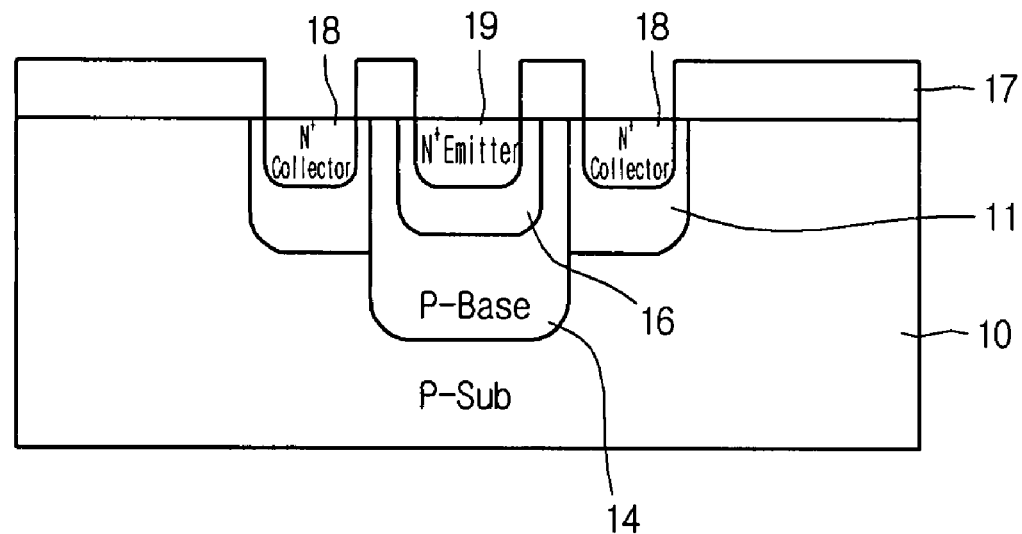

Referring to FIG. 4, a third photoresist pattern 17 is formed by applying a photoresist material to semiconductor substrate 10, and developing and exposing the photoresist material. Thereafter, high concentration N-type impurity ions are implanted in N⁺ emitter region 16 and collector region 11 using third photoresist pattern 17 as a mask.

Accordingly, the implantation of N-type impurity ions forms emitter 19 and collector 18.

Referring to FIG. 5, high concentration P-type impurity ions may be implanted in P-type semiconductor substrate 10 to form a base 20 using a fourth photoresist pattern (not shown) formed on P-type semiconductor substrate 10.

That is, in one embodiment, base 20 may be formed on P-type semiconductor substrate 10, and collector 18 may be formed on a region of P-type semiconductor substrate 10 on which N-type impurity ions are implanted. Also, P-type impurity ions may be implanted into the region where N-type impurity ions are implanted, and N-type impurity ions may be implanted into the region where P-type impurity ions are implanted, thereby forming emitter 19.

A field oxide layer may be formed through a local oxidation of silicon (LOCOS) process, or a trench oxide layer may be formed through a shallow trench isolation (STI) process between collector 18 and base 20. Detailed descriptions of these processes will be omitted.

Thereafter, an interlayer insulating layer with contact holes (not shown) may be provided on emitter 19, collector 18, and base 20. Thereafter, plugs may be formed in the contact holes.

In one embodiment, the base width is minimized in order to provide a semiconductor device with high-speed characteristics.

Although embodiments consistent with the present invention have been described in detail with reference to a number of illustrative examples thereof, it should be understood that modifications and variations of these embodiments can be devised by those skilled in the art without departing from the spirit and scope of the present invention. More particularly, various variations and modifications are possible in the component parts and/or arrangements of the subject combination arrangement. In addition to variations and modifications in the component parts and/or arrangements, alternative uses will also be apparent to those skilled in the art.

What is claimed is:

1. A method for manufacturing a semiconductor device, comprising:

forming a collector region of a second conductivity type in a semiconductor substrate of a first conductivity type through implanting impurity ions of the second conductivity type into the semiconductor substrate;

forming a base region of the first conductivity type in the collector region through implanting impurity ions of the first conductivity type into the collector region;

forming an emitter region of the second conductivity type in the base region through implanting impurity ions of the second conductivity type into the base region;

forming an emitter in the emitter region through implanting high concentration impurity ions of the second conductive type into the emitter region;

forming a collector in the collector region through implanting high concentration impurity ions of the second conductive type into the collector region; and forming a base in the semiconductor substrate through implanting high concentration impurity ions of the first conductive type into the semiconductor substrate, wherein forming the emitter region of the second conductivity type and forming the base region of the first conductivity type comprise performing a rapid thermal processing, wherein forming the emitter region and forming the base region are performed at substantially the same time by the rapid thermal processing, wherein the base region comprises a P-type base region and the emitter region comprises an N-type emitter region, and wherein P-type impurity ions in the P-type base region have a higher diffusion coefficient than N-type impurity ions in the N-type emitter region, and a width of the P-type base region is self-aligned by the difference of the diffusion coefficient between the P-type impurity ions in the P-type base region and the N-type impurity ions in the N-type emitter region.

2. The method according to claim 1, wherein the rapid thermal processing is performed at a temperature of about 900-1100° C. for a duration of about 30-60 seconds.

3. The method according to claim 1, wherein the emitter region of the second conductive type and the base region of the first conductive type are self-aligned.

4. The method according to claim 1, wherein the impurity ions of the first conductivity type include Boron (B).

5. The method according to claim 1, wherein the impurity ions of the second conductivity type include Phosphorous (P) or Arsenic (As).

\* \* \* \* \*